US011328893B2

(12) United States Patent
Koo

(10) Patent No.: US 11,328,893 B2
(45) Date of Patent: May 10, 2022

(54) PLASMA PROCESSING SYSTEM

(71) Applicant: XIA TAI XIN SEMICONDUCTOR (QING DAO) LTD., Qingdao (CN)

(72) Inventor: Deog-Ja Koo, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 417 days.

(21) Appl. No.: 16/663,373

(22) Filed: Oct. 25, 2019

(65) Prior Publication Data
US 2020/0203115 A1   Jun. 25, 2020

Related U.S. Application Data

(60) Provisional application No. 62/778,934, filed on Dec. 13, 2018.

(51) Int. Cl.
*H01J 37/15* (2006.01)
*H01L 21/683* (2006.01)
*H01J 37/32* (2006.01)

(52) U.S. Cl.
CPC ........ *H01J 37/15* (2013.01); *H01J 37/32082* (2013.01); *H01L 21/6833* (2013.01); *H01J 37/32* (2013.01); *H01L 21/6836* (2013.01)

(58) Field of Classification Search
CPC ............... H01L 21/683; H01L 21/6833; H01L 21/68735; H01L 21/6836; H01J 37/15; H01J 37/32; H01J 37/32082; H01J 37/32183; H01J 37/62642; H01J 37/32715; H01J 37/32091
USPC ...................................................... 361/234
See application file for complete search history.

(56) References Cited

U.S. PATENT DOCUMENTS

2018/0012784 A1\* 1/2018 Eto ................... H01J 37/32715
2019/0363003 A1\* 11/2019 Sarode Vishwanath ..................... H01J 37/321

\* cited by examiner

*Primary Examiner* — Danny Nguyen
(74) *Attorney, Agent, or Firm* — ScienBiziP, P.C.

(57) ABSTRACT

A plasma processing system has been disclosed. The plasma processing system includes an electrostatic chuck (ESC) and an edge ring assembly. The edge ring assembly has a conductive ring configured to generate an electric field to adjust the direction of ions.

20 Claims, 6 Drawing Sheets

| Parameter | | 1 | 2 | 3 | 4 | 5 | 6 | 7 |
|---|---|---|---|---|---|---|---|---|
| Step Description | | Nitride1 | Oxide1 | Oxide1 OE | Nitride2 | Oxide2 | Oxide2 OE | Nitride3 |
| Step Type | | Time | EPD | Time | Time | EPD | Time | Time |
| Process Time (sec) | | 150±100 | | | 80±30 | | | 30±20 |
| Over Etch (%) | | | | 0~100 | | | 0~100 | |
| Pressure (mT) | | 15±5 | 15±5 | 15±5 | 15±5 | 15±5 | 15±5 | 15±5 |
| Source Power (w) | | 800±300 | 800±300 | 800±300 | 800±300 | 800±300 | 800±300 | 800±300 |
| Bias Power (w) | | 3000±1000 | 11000±2000 | 11000±2000 | 3000±1000 | 12000±2000 | 12000±2000 | 500±300 |
| Gas 1 | | 50±50 | 50±50 | 50±50 | 50±50 | 50±50 | 50±50 | 50±50 |
| Gas 2 | | 50±50 | 50±50 | 50±50 | 50±50 | 50±50 | 50±50 | 50±50 |
| Gas 7 | | 10±10 | 10±10 | 10±10 | 10±10 | 10±10 | 10±10 | 10±10 |
| Edge Power | Voltage(V) | 0 – 300 | 0 – 300 | 0 – 300 | 0 – 300 | 0 – 300 | 0 – 300 | 0 – 300 |
| | Frequency | 1kHz – 10MHz | 1kHz – 10MHz | 1kHz – 10MHz | 1kHz – 10MHz | 1kHz – 10MHz | 1kHz – 10MHz | 1kHz – 10MHz |
| | Duty ratio | 10% – 90% | 10% – 90% | 10% – 90% | 10% – 90% | 10% – 90% | 10% – 90% | 10% – 90% |

FIG. 2

| Parameter | 1 | 2 | 3 | 4 | 5 | 6 | 7 |
|---|---|---|---|---|---|---|---|
| Step Description | Nitride1 | Oxide1 | Oxide1 OE | Nitride2 | Oxide2 | Oxide2 OE | Nitride3 |
| Step Type | Time | EPD | Time | Time | EPD | Time | Time |
| Process Time (sec) | 10±100 | | | 50±30 | | | 50±20 |
| Over Etch (%) | | | 0-100 | | | 0-100 | |
| Pressure (mT) | 15±5 | 15±5 | 15±5 | 15±5 | 15±5 | 15±5 | 15±5 |
| Source Power (w) | 800±300 | 800±300 | 800±300 | 800±300 | 800±300 | 800±300 | 800±300 |
| Bias Power (w) | 3000±1000 | 11000±2000 | 11000±2000 | 3000±1000 | 12000±2000 | 13000±2000 | 500±300 |
| Gas 1 | 50±50 | 50±50 | 50±50 | 50±50 | 50±50 | 50±50 | 50±50 |
| Gas 2 | 50±50 | 50±50 | 50±50 | 50±50 | 50±50 | 50±50 | 50±50 |
| ... | | | | | | | |
| Gas 7 | 10±10 | 10±10 | 10±10 | 10±10 | 10±10 | 10±10 | 10±10 |
| Edge Power (W) | 0 - 500W | 0 - 500W | 0 - 500W | 0 - 500W | 0 - 500W | 0 - 500W | 0 - 500W |

FIG. 3

PLASMA PROCESSING SYSTEM

CROSS-REFERENCES TO RELATED APPLICATIONS

This application claims the benefit of U.S. Provisional Patent Application No. 62/778,934 filed on Dec. 13, 2018, which is hereby incorporated by reference herein and made a part of specification.

BACKGROUND

1. Field

The present disclosure generally relates to plasma processing system, and more particularly, plasma processing system having edge ring assembly for bending direction of ions in plasma processes.

2. Related Art

Inconsistency of plasma direction in semiconductor processes leads to poor uniformity of wafer edge plasma and causes varying energy of ion bombardment. Wafers fabricated at early or late stage of a lifecycle an edge ring form tilted pattern on the wafer edge and cause yield loss.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2 illustrates a table of direct current (DC) power supply for different process according to some embodiments of the instant disclosure;

FIG. 3 illustrates a table of radio frequency (RF) power supply for different process according to some embodiments of the instant disclosure;

DETAILED DESCRIPTION

Figure 1:
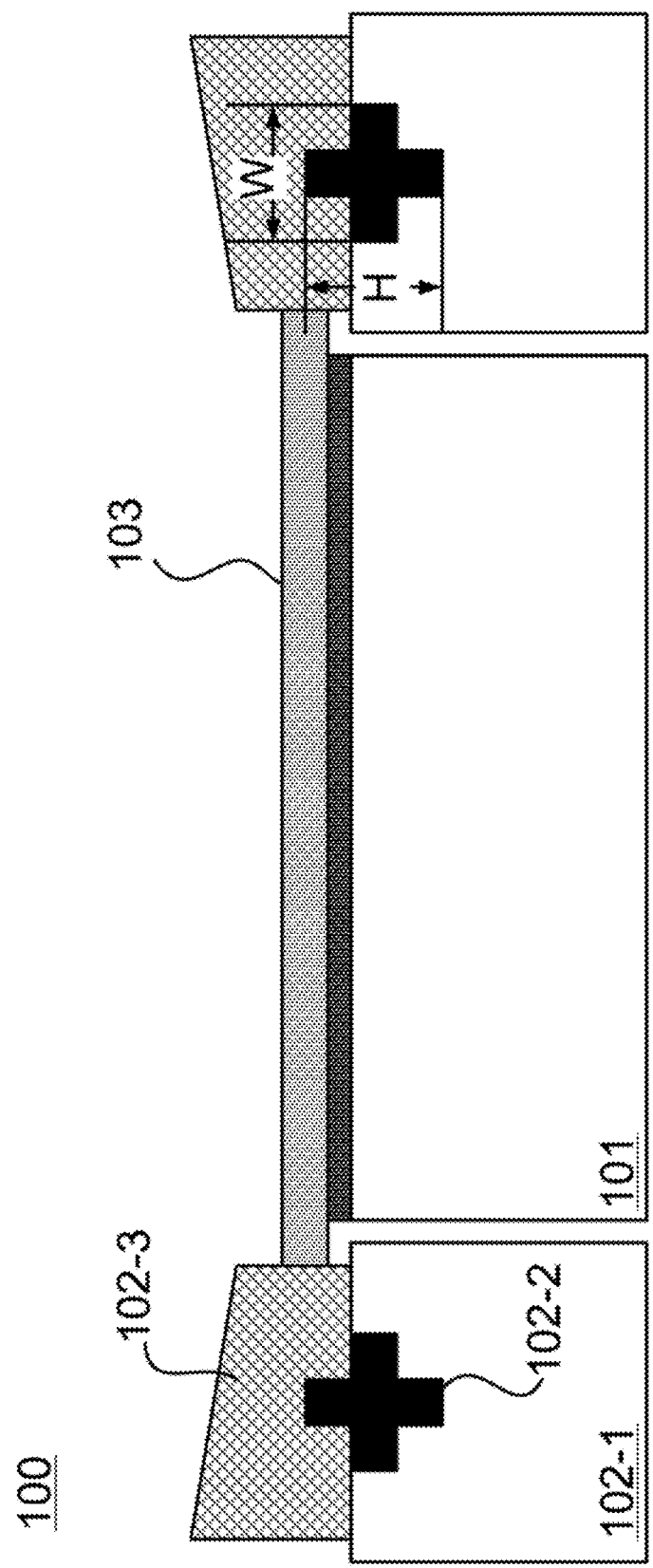
FIG. 1 illustrates a cross sectional view of a plasma processing system according to some embodiments of the instant disclosure.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 illustrates a cross sectional view of a plasma processing system 100 according to some embodiments of the instant disclosure. The plasma processing system 100 includes an electrostatic chuck (ESC) 101 and an edge ring assembly 102. The edge ring assembly 102 surrounds the ESC 101. The edge ring assembly 102 includes a base ring 102-1, a conductive ring 102-2, and a cover ring 102-3. In some embodiments, the base ring 102-1 is laterally surrounding the ESC 101. In some embodiments, the base ring 102-1 has a groove. In some embodiments, the cover ring 102-3 is coupleable over the conductive ring 102-2. The cover ring 102-3 is made of at least one material including quartz, silicon, ceramics, or Vespel. In some embodiments, a user can provide a wafer 103 to the ESC 101 surrounded by the base ring 102-1.

In some embodiments, the conductive ring 102-2 is made of at least one material including silicon, carbon or aluminum. In some embodiments, the conductive ring 102-2 is a toroid with a polygonal section. The polygonal section has a plurality of flanges extending away from a center of the polygonal section. A portion of the plurality of flanges is accommodated within the groove of the base ring 102-1. A remaining portion of the plurality of flanges is covered by the cover ring 102-3. In some embodiments, the plurality of flanges has four flanges. Three of the four flanges are embedded within the groove of the base ring 102-1. One of the flanges is covered by the cover ring 102-3.

In some embodiments, the plurality of flanges extending symmetrically from the center of the polygonal section. A length of each of the plurality of flanges from the center of the polygonal section ranges from about 2.5 to 14 millimeters (mm). A thickness of each of the plurality of flanges ranges from about 5 to 10 millimeters (mm)

In some embodiments, the plurality of flanges extending asymmetrically from the center of the polygonal section. In some embodiments, two flanges of the plurality of flanges extending horizontally from the center of the polygonal section are shorter in length than two flanges of the plurality of flanges extending vertically from the center of the polygonal section. In some embodiments, two flanges of the plurality of flanges extending horizontally from the center of the polygonal section are longer in length than two flanges of the plurality of flanges extending vertically from the center of the polygonal section. A length of each of the two flanges extending horizontally from the center of the polygonal section ranges from about 2.5 to 14 millimeters (mm). A length of each of the two flanges extending vertically from the center of the polygonal section ranges from about 2.5 to 14 millimeters (mm).

In some embodiments, the polygonal section forms a cross shape. The plurality of flanges of the polygonal section are perpendicular to a neighboring flange. The groove of the base ring 102-1 has a step profile to accommodate three of the plurality of flanges. The cover ring has a groove to cover one of the plurality of flanges.

FIG. 2 illustrates a table of DC power supply for different process according to some embodiments of the instant disclosure. In some embodiments, the plasma processing system 100 further includes a DC power supply coupled to the conductive ring 102-2. A supplied voltage of the DC power supply ranges from 0 to 300V. A frequency of the DC power supply ranges from 1 KHz to 10 MHz. A duty ratio of the DC power supply ranges from 10% to 90%.

FIG. 3 illustrates a table of RF power supply for different process according to some embodiments of the instant disclosure. In some embodiments, the system further includes a RF power supply coupled to the conductive ring 102-2. A supplied power of the RF power supply ranges from 0 to 500 W.

Figure 4:
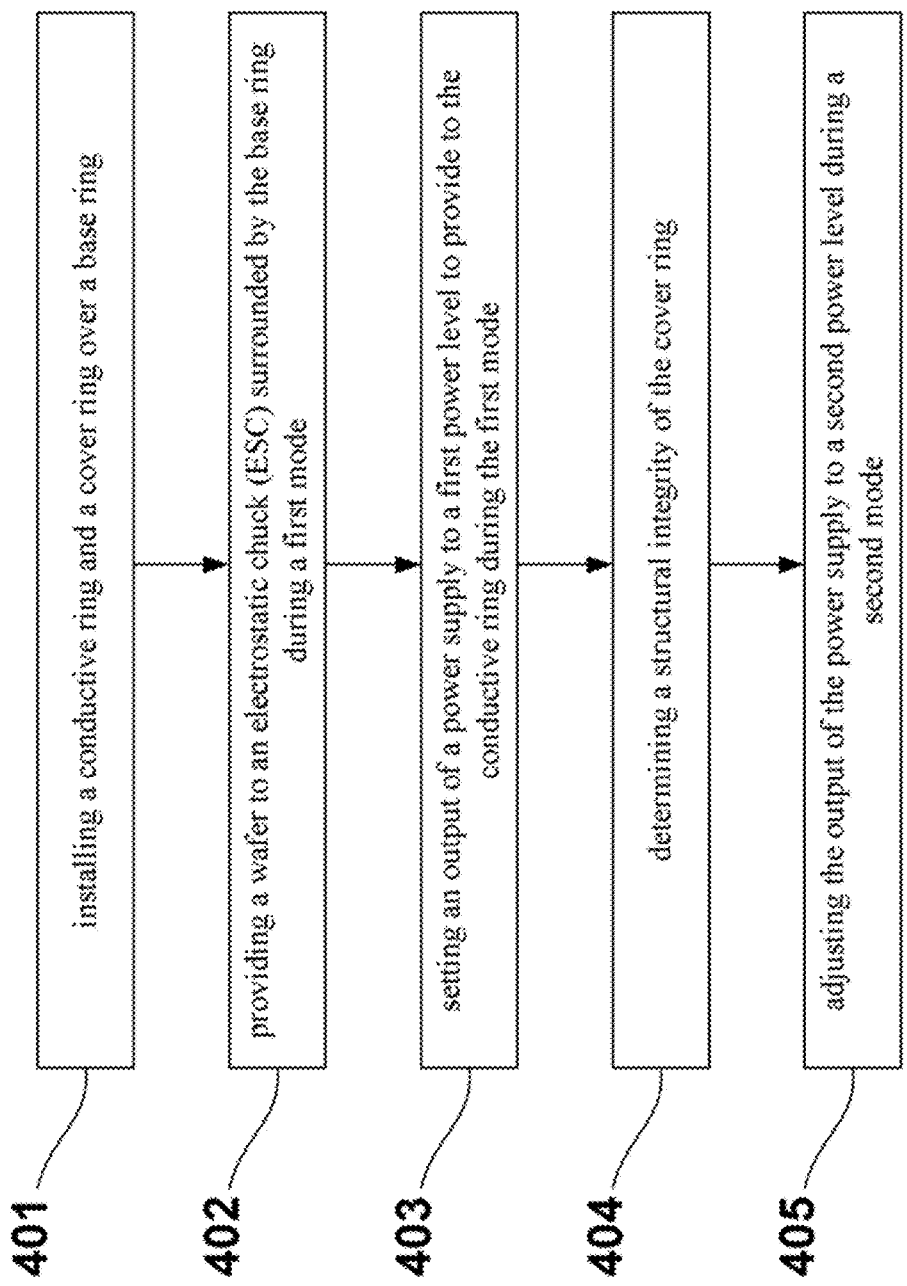
FIG. 4 illustrates a flowchart of a method for operating a plasma processing system according to some embodiments of the instant disclosure

FIG. 4 illustrates a flowchart of a method for operating a plasma processing system according to some embodiments of the instant disclosure. The method for operating a plasma processing system includes installing a conductive ring and a cover ring over a base ring (401), providing a wafer to an electrostatic chuck (ESC) surrounded by the base ring during a first mode (402), setting an output of a power supply to a first power level to provide to the conductive ring during the first mode (403), determining a structural integrity of the cover ring (404), and adjusting the output of the power supply to a second power level during a second mode (405). In some embodiments, the second power level is determined according to the structural integrity of the cover ring. In some embodiments, the conductive ring is a toroid with a polygonal section. The polygonal section has a plurality of flanges extending away from a center of the polygonal section. The conductive ring is sandwiched between the base ring and the cover ring In some embodiments, the power supply is a DC power supply. A supplied voltage of the DC power supply ranges from 0 to 300V. A frequency of the DC power supply ranges from 1 KHz to 10 MHz. A duty ratio of the DC power supply ranges from 10% to 90%.

In some embodiments, the power supply is a RF power supply. A supplied power of the RF power supply ranges from 0 to 500 W.

Figure 5:
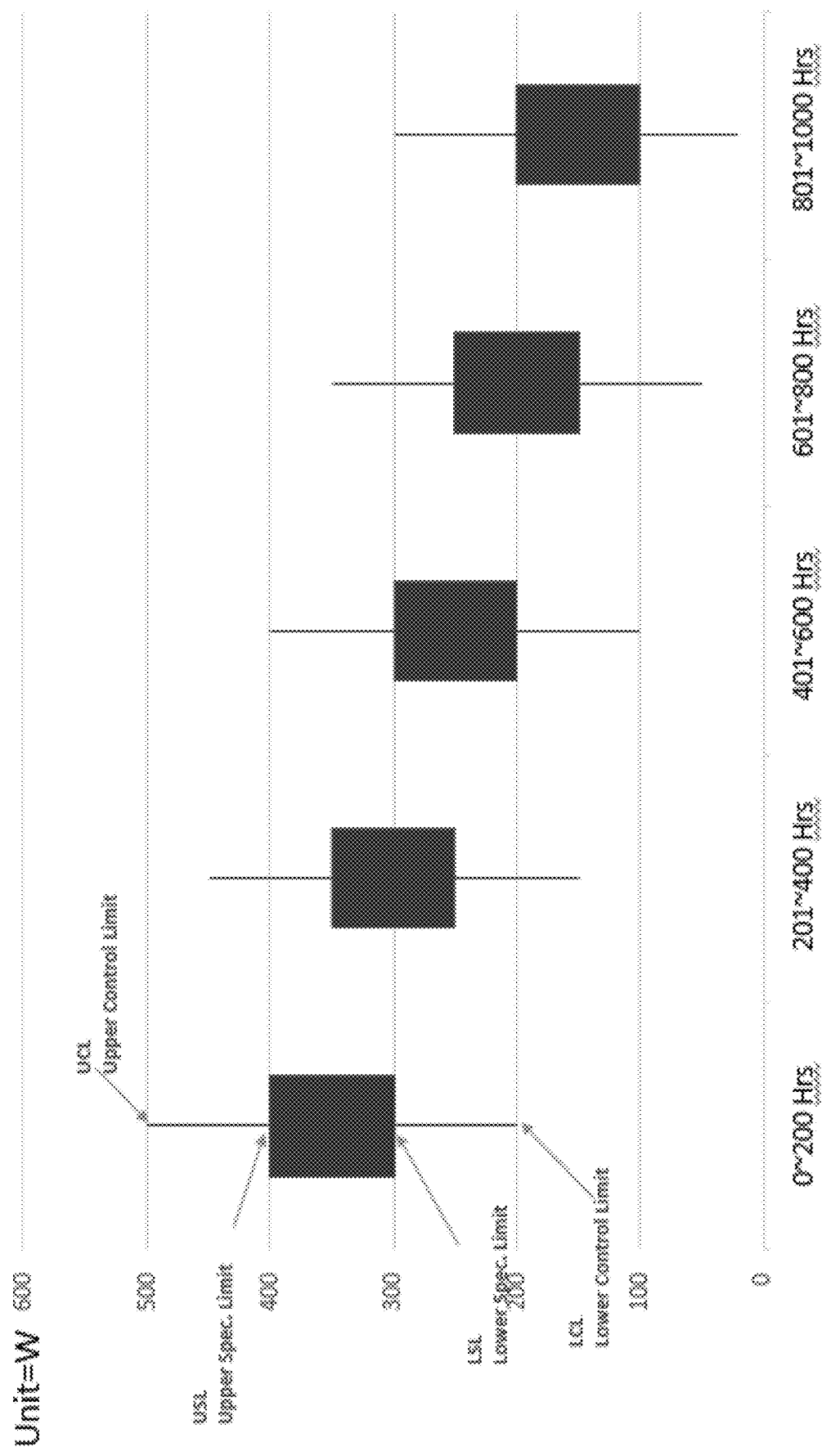
FIG. 5 illustrates a chart of a power trend of an edge ring assembly according to some embodiments of the instant disclosure.

FIG. 5 illustrates a chart of a power trend of an edge ring assembly according to some embodiments of the instant disclosure. In some embodiments, the structural integrity of the cover ring includes a thickness of the cover ring and the first power level is decreased to the second power level when the thickness of the cover ring is reduced as compared to the thickness of the cover ring before the first mode. In some embodiments, the lifecycle of the edge ring assembly is around 1000 hours.

In the first 200 hours, the edge power applied to the edge ring may fall between upper and lower control limits (i.e., the highest and lowest acceptable power). In some embodiments, the lower and upper control limits may be about 200 W and about 500 W, respectively. The power level of the edge ring assembly may fall between upper and lower specification limits (i.e., the power limits suggested by currently available specifications). In some embodiments, the lower and upper specification limits may be about 300 W and about 400 W, respectively.

In the second 200 hours, the edge power applied to the edge ring may fall between upper and lower control limits (i.e., the highest and lowest acceptable power). In some embodiments, the lower and upper control limits may be about 150 W and about 450 W, respectively. The power level of the edge ring assembly may fall between upper and lower specification limits (i.e., the power limits suggested by currently available specifications). In some embodiments, the lower and upper specification limits may be about 250 W and about 350 W, respectively.

In the third 200 hours, the edge power applied to the edge ring may fall between upper and lower control limits (i.e., the highest and lowest acceptable power). In some embodiments, the lower and upper control limits may be about 100 W and about 400 W, respectively. The power level of the edge ring assembly may fall between upper and lower specification limits (i.e., the power limits suggested by currently available specifications). In some embodiments, the lower and upper specification limits may be about 200 W and about 300 W, respectively.

In the fourth 200 hours, the edge power applied to the edge ring may fall between upper and lower control limits (i.e., the highest and lowest acceptable power). In some embodiments, the lower and upper control limits may be about 50 W and about 350 W, respectively. The power level of the edge ring assembly may fall between upper and lower specification limits (i.e., the power limits suggested by currently available specifications). In some embodiments, the lower and upper specification limits may be about 150 W and about 250 W, respectively.

In the fifth 200 hours, the edge power applied to the edge ring may fall between upper and lower control limits (i.e., the highest and lowest acceptable power). In some embodiments, the lower and upper control limits may be about 20 W and about 300 W, respectively. The power level of the edge ring assembly may fall between upper and lower specification limits (i.e., the power limits suggested by currently available specifications). In some embodiments, the lower and upper specification limits may be about 100 W and about 200 W, respectively.

Figure 6:
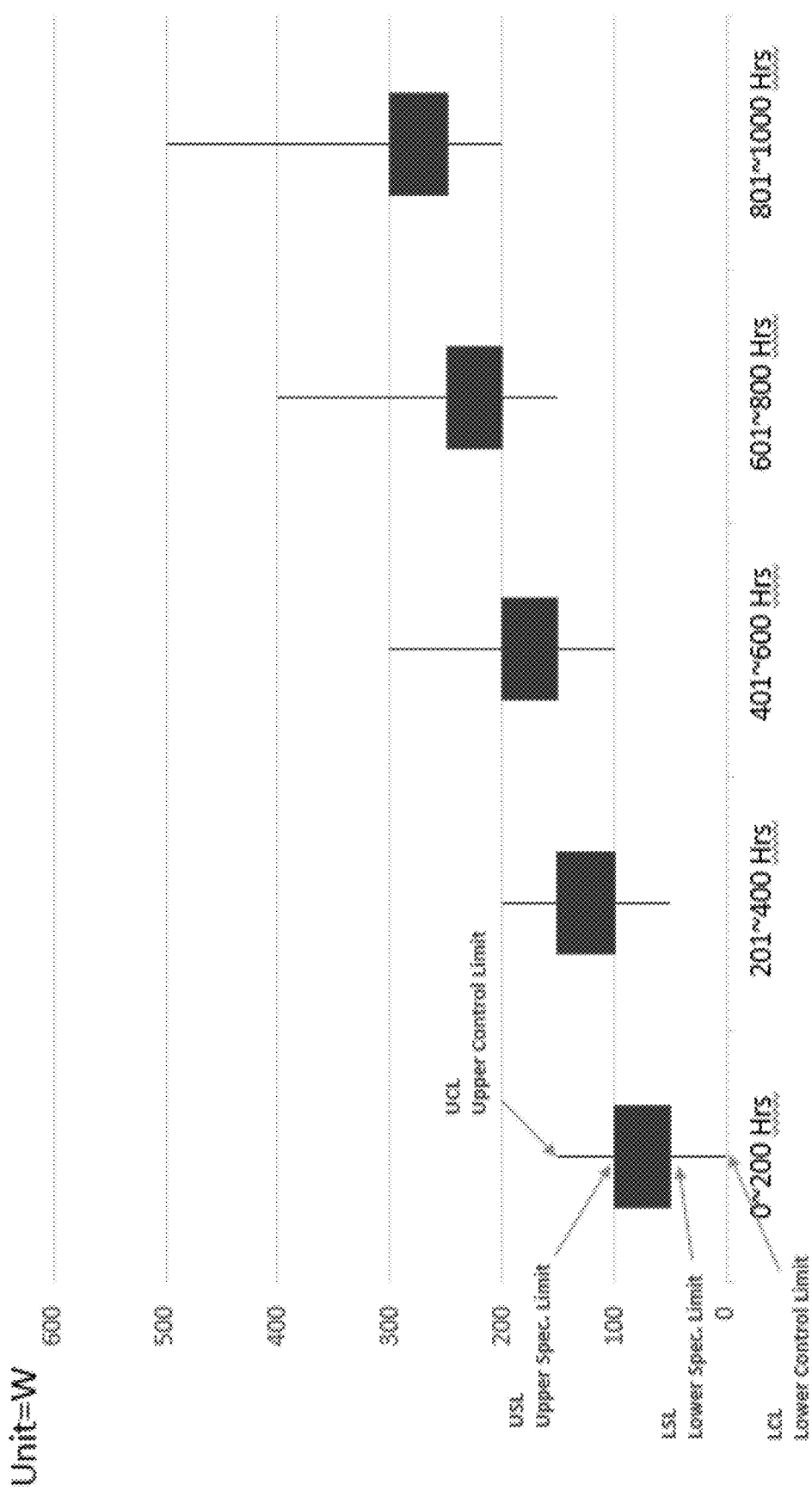
FIG. 6 illustrates a chart of a power trend of an edge ring assembly according to some embodiments of the instant disclosure.

FIG. 6 illustrates a chart of a power trend of an edge ring assembly according to some embodiments of the instant disclosure. In some embodiments, the structural integrity of the cover ring includes a thickness of the cover ring and the first power level is increased to the second power level when the thickness of the cover ring is reduced as compared to the thickness of the cover ring before the first mode. In some embodiments, the lifecycle of the edge ring assembly is around 1000 hours.

In the first 200 hours, the edge power applied to the edge ring may fall between upper and lower control limits (i.e., the highest and lowest acceptable power). In some embodiments, the lower and upper control limits may be about 0 W and about 150 W, respectively. The power level of the edge ring assembly may fall between upper and lower specification limits (i.e., the power limits suggested by currently available specifications). In some embodiments, the lower and upper specification limits may be about 50 W and about 100 W, respectively.

In the second 200 hours, the edge power applied to the edge ring may fall between upper and lower control limits (i.e., the highest and lowest acceptable power). In some embodiments, the lower and upper control limits may be about 50 W and about 200 W, respectively. The power level of the edge ring assembly may fall between upper and lower specification limits (i.e., the power limits suggested by currently available specifications). In some embodiments, the lower and upper specification limits may be about 100 W and about 150 W, respectively.

In the third 200 hours, the edge power applied to the edge ring may fall between upper and lower control limits (i.e., the highest and lowest acceptable power). In some embodiments, the lower and upper control limits may be about 100 W and about 300 W, respectively. The power level of the edge ring assembly may fall between upper and lower specification limits (i.e., the power limits suggested by currently available specifications). In some embodiments, the lower and upper specification limits may be about 150 W and about 200 W, respectively.

In the fourth 200 hours, the edge power applied to the edge ring may fall between upper and lower control limits (i.e., the highest and lowest acceptable power). In some embodiments, the lower and upper control limits may be about 150 W and about 400 W, respectively. The power level of the edge ring assembly may fall between upper and lower specification limits (i.e., the power limits suggested by currently available specifications). In some embodiments, the lower and upper specification limits may be about 200 W and about 250 W, respectively.

In the fifth 200 hours, the edge power applied to the edge ring may fall between upper and lower control limits (i.e., the highest and lowest acceptable power). In some embodiments, the lower and upper control limits may be about 200 W and about 500 W, respectively. The power level of the edge ring assembly may fall between upper and lower specification limits (i.e., the power limits suggested by currently available specifications). In some embodiments, the lower and upper specification limits may be about 250 W and about 300 W, respectively.

Accordingly, one aspect of the instant disclosure provides a plasma processing system that comprises an electrostatic chuck (ESC); and an edge ring assembly surrounding the ESC. The edge ring assembly comprises a base ring laterally surrounding the ESC and having a groove; a conductive ring being a toroid with a polygonal section, the polygonal section having a plurality of flanges extending away from a center of the polygonal section, a portion of the plurality of flanges being accommodated within the groove of the base ring; and a cover ring coupleable over the conductive ring, a remaining portion of the plurality of flanges being covered by the cover ring.

In some embodiments, the system further comprises a DC power supply coupled to the conductive ring.

In some embodiments, a supplied voltage of the DC power supply ranges from 0 to 300V, a frequency of the DC power supply ranges from 1 KHz to 10 MHz, and a duty ratio of the DC power supply ranges from 10% to 90%.

In some embodiments, the system further comprises a RF power supply coupled to the conductive ring.

In some embodiments, a supplied power of the RF power supply ranges from 0 to 500 W.

In some embodiments, the cover ring is made of at least one material including quartz, silicon, ceramics or Vespel.

In some embodiments, the conductive ring is made of at least one material including silicon, carbon or aluminum.

In some embodiments, the plurality of flanges being four flanges, three of the four flanges being embedded within the groove of the base ring and one of the flanges being covered by the cover ring.

In some embodiments, the plurality of flanges extending symmetrically from the center of the polygonal section.

In some embodiments, a length of each of the plurality of flanges from the center of the polygonal section ranges from about 2.5 to 14 millimeters (mm).

In some embodiments, the plurality of flanges extending asymmetrically from the center of the polygonal section.

In some embodiments, two flanges of the plurality of flanges extending horizontally from the center of the polygonal section is shorter in length than two flanges of the plurality of flanges extending vertically from the center of the polygonal section.

In some embodiments, a length of each of the two flanges extending horizontally from the center of the polygonal section ranges from about 2.5 to 14 millimeters (mm) and a length of each of the two flanges extending vertically from the center of the polygonal section ranges from about 2.5 to 14 millimeters (mm).

In some embodiments, the polygonal section forms a cross shape, the plurality of flanges of the polygonal section being perpendicular to a neighboring flange, the groove of the base ring having a step profile to accommodate three of the plurality of flanges, and the cover ring having a groove to cover one of the plurality of flanges.

Accordingly, another aspect of the instant disclosure provides a method for operating a plasma processing system that comprises installing a conductive ring and a cover ring over a base ring, the conductive ring being a toroid with a polygonal section, the polygonal section having a plurality of flanges extending away from a center of the polygonal section, the conductive ring being sandwiched between the base ring and the cover ring; providing a wafer to an electrostatic chuck (ESC) surrounded by the base ring during a first mode; setting an output of a power supply to a first power level to provide to the conductive ring during the first mode; determining a structural integrity of the cover ring; and adjusting the output of the power supply to a second power level during a second mode, wherein the second power level is determined according to the structural integrity of the cover ring.

In some embodiments, the power supply is a DC power supply, a supplied voltage of the DC power supply ranges from 0 to 300V, a frequency of the DC power supply ranges from 1 KHz to 10 MHz, and a duty ratio of the DC power supply ranges from 10% to 90%.

In some embodiments, the power supply is a RF power supply, a supplied power of the RF power supply ranges from 0 to 500 W.

In some embodiments, the structural integrity of the cover ring includes a thickness of the cover ring and the first power level is increased to the second power level when the thickness of the cover ring is reduced as compared to the thickness of the cover ring before the first mode.

In some embodiments, the structural integrity of the cover ring includes a thickness of the cover ring and the first power level is decreased to the second power level when the thickness of the cover ring is reduced as compared to the thickness of the cover ring before the first mode.

Accordingly, another aspect of the instant disclosure provides a structure of an edge ring assembly that comprises a conductive ring being a toroid with a cross shaped section, the cross shaped section having four flanges extending away from a center of the cross shaped section, and the four flanges being perpendicular to a neighboring flange; a base ring having a groove to accommodate a first part of the conductive ring; and a cover ring having a groove to cover a second part of the conductive ring.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A plasma processing system, comprising:
an electrostatic chuck (ESC); and
an edge ring assembly surrounding the ESC, the edge ring assembly comprising:
a base ring laterally surrounding the ESC and having a groove;
a conductive ring being a toroid with a polygonal section, the polygonal section having a plurality of flanges extending away from a center of the polygonal section, a portion of the plurality of flanges being accommodated within the groove of the base ring; and
a cover ring coupleable over the conductive ring, a remaining portion of the plurality of flanges being covered by the cover ring.

2. The system in claim 1, further comprising a DC power supply coupled to the conductive ring.

3. The system in claim 2, wherein a supplied voltage of the DC power supply ranges from 0 to 300V, a frequency of the DC power supply ranges from 1 KHz to 10 MHz, and a duty ratio of the DC power supply ranges from 10% to 90%.

4. The system in claim 1, further comprising a RF power supply coupled to the conductive ring.

5. The system in claim 4, wherein a supplied power of the RF power supply ranges from 0 to 500 W.

6. The system in claim 1, wherein the cover ring is made of at least one material including quartz, silicon, ceramics or Vespel.

7. The system in claim 1, wherein the conductive ring is made of at least one material including silicon, carbon or aluminum.

8. The system in claim 1, wherein the plurality of flanges being four flanges, three of the four flanges being embedded within the groove of the base ring and one of the flanges being covered by the cover ring.

9. The system in claim 1, wherein the plurality of flanges extending symmetrically from the center of the polygonal section.

10. The system in claim 9, wherein a length of each of the plurality of flanges from the center of the polygonal section ranges from about 2.5 to 14 millimeters (mm).

11. The system in claim 1, wherein the plurality of flanges extending asymmetrically from the center of the polygonal section.

12. The system in claim 11, wherein two flanges of the plurality of flanges extending horizontally from the center of the polygonal section is shorter in length than two flanges of the plurality of flanges extending vertically from the center of the polygonal section.

13. The system in claim 12, wherein a length of each of the two flanges extending horizontally from the center of the polygonal section ranges from about 2.5 to 14 millimeters (mm) and a length of each of the two flanges extending vertically from the center of the polygonal section ranges from about 2.5 to 14 millimeters (mm).

14. The system in claim 1, wherein the polygonal section forms a cross shape, the plurality of flanges of the polygonal section being perpendicular to a neighboring flange, the groove of the base ring having a step profile to accommodate three of the plurality of flanges, and the cover ring having a groove to cover one of the plurality of flanges.

15. A method for operating a plasma processing system, comprising:
installing a conductive ring and a cover ring over a base ring, the conductive ring being a toroid with a polygonal section, the polygonal section having a plurality of flanges extending away from a center of the polygonal section, the conductive ring being sandwiched between the base ring and the cover ring;
providing a wafer to an electrostatic chuck (ESC) surrounded by the base ring during a first mode;
setting an output of a power supply to a first power level to provide to the conductive ring during the first mode;
determining a structural integrity of the cover ring; and
adjusting the output of the power supply to a second power level during a second mode, wherein the second power level is determined according to the structural integrity of the cover ring.

16. The method in claim 15, wherein the power supply is a DC power supply, a supplied voltage of the DC power supply ranges from 0 to 300V, a frequency of the DC power supply ranges from 1 KHz to 10 MHz, and a duty ratio of the DC power supply ranges from 10% to 90%.

17. The method in claim 15, wherein the power supply is a RF power supply, a supplied power of the RF power supply ranges from 0 to 500 W.

18. The method in claim 15, wherein the structural integrity of the cover ring includes a thickness of the cover ring and the first power level is increased to the second power level when the thickness of the cover ring is reduced as compared to the thickness of the cover ring before the first mode.

19. The method in claim 15, wherein the structural integrity of the cover ring includes a thickness of the cover ring and the first power level is decreased to the second power level when the thickness of the cover ring is reduced as compared to the thickness of the cover ring before the first mode.

20. A structure of an edge ring assembly, comprising:
a conductive ring being a toroid with a cross shaped section, the cross shaped section having four flanges extending away from a center of the cross shaped section, and the four flanges being perpendicular to each other;
a base ring having a groove to accommodate a first part of the conductive ring; and
a cover ring having a groove to cover a second part of the conductive ring.

* * * * *